United States Patent [19]

Nakao

[11] 4,389,714
[45] Jun. 21, 1983

[54] MEMORY DEVICE
[75] Inventor: Masumi Nakao, Tokyo, Japan
[73] Assignee: Nippon Electric Co., Ltd., Tokyo, Japan
[21] Appl. No.: 189,275
[22] Filed: Sep. 22, 1980
[30] Foreign Application Priority Data
  Sep. 20, 1979 [JP] Japan .................................. 54/121365
[51] Int. Cl.³ .............................................. G11C 11/40
[52] U.S. Cl. ....................................... 365/189; 365/230
[58] Field of Search ................................. 365/189, 230
[56] References Cited
  U.S. PATENT DOCUMENTS
  4,031,552  6/1977  Reed et al. ............................ 365/222

Primary Examiner—Terrell W. Fears
Attorney, Agent, or Firm—Sughrue, Mion, Zinn, Macpeak & Seas

[57] ABSTRACT

An memory device having a stable write function and operable with low power consumption is disclosed. The memory device comprises a plurality of digit live pairs, a plurality of memory cells, a bus line, selection means for operatively and selectively transferring a logic level of one digit line of one digit line pair to the bus line and a plurality of digit drive circuits, each of the digit drive circuits being responsive to a first logic level of one digit line of the associated digit line pair for operatively driving a potential of the other digit line of the same digit line pair to a second logic level opposite to the first logic level.

20 Claims, 20 Drawing Figures

MEMORY DEVICE

BACKGROUND OF THE INVENTION

The present invention relates to a memory device, and more particularly to a dynamic type semiconductor memory device fabricated on a semiconductor chip.

Dynamic type memory device employing single transistor (one transistor) type memory cells are widely used. In this type of memory device, a plurality of memory cells are disposed at intersections of address lines and digit lines, as is well known, and a plurality of sense amplifiers are provided for respective digit line pairs. As the sense amplifiers, the structures disclosed by U.S. Pat. Nos. 3,588,844 and 3,514,765 issued to Christensen have been known. In this system, the digit line is devided into equal parts and connected to a balanced or differential amplifier. This type of system has been widely employed with varying degrees of success. However, various embodiments of this type system of necessarily consume D.C. power.

In this connection, a memory system employing a dynamic type sense amplifier having no load elements was proposed by U.S. Pat. No. 4,061,954 issued to Proebsting et.al. In this system, true and complement digit lines are connected through resistances to input nodes of an amplifier comprised of cross-coupled transistors. This system consumes no D.C. power.

However, in this system, the sense amplifier has no capability to drive the digit line toward a high potential. Therefore, if a single input/output (I/O) bus line structure is employed for saving wiring space in which only one digit line of the digit line pair is connected to the I/O bus line and the other digit line is left alone, it is difficult to drive the mentioned other digit line to the high potential on a write operation in comparison to the case that the mentioned one digit line is driven to the high level through the I/O bus line. This results in failure of the write operation. Therefore, it has been difficult to incorporate the mentioned dynamic type sense amplifier into the single bus line structure of the memory.

Hence, a memory device of a high-density and operable with high-stability has been desired.

SUMMARY OF THE INVENTION

It is an object of the present invention to provide a memory device having stable write function.

It is another object of the present invention to provide a dynamic memory device operable at a high speed and with low power consumption.

A memory device according to the present invention comprises a plurality of memory cells arranged at intersections of a plurality of address lines and a plurality of first and second digit lines, row selection means for selecting one of the rows, a single input/output bus line, a plurality of sense amplifiers, each having a first input node connectable to one of the first digit lines and a second input node connectable to one of the second digit lines, a plurality of column selection gates coupled between the first digit lines and the single input/output bus line and column selection means for selectively enabling one of the column selection gates, and a plurality of drive circuits, each of the drive circuits being responsive to one of the logic levels at the associated one of the first digit line for driving the associated one of the second digit line to the other logic level.

In the present invention, the sense amplifiers are preferably of the dynamic type having no load elements in view of power consumption and the drive circuits are preferably enabled when the write operation is performed. It is also effective to enable the drive circuit after the read-out state of the associated sense amplifier is established.

According to the present invention, the levels at the respective second digit lines having no electrical connection to an I/O bus line can be driven towards their specified potentials and held for a long time without reduction of levels. Therefore, in addition to the first digit line which can be driven by the I/O bus line, the second digit line can be driven in a stable manner by the drive circuit.

In this invention, the mentioned one of the logic level is preferably assumed to be ground potential while the other of the logic levels is assumed to be a level near a power supply other than the ground potential.

In the present invention, there is no necessity to enable all the drive circuits. It is enough to enable only the drive circuit associated to selected first and second digit lines. The drive circuits are preferably made active after data to be written is transferred to the relevant first digit line. Then, in response to the level at the first digit line, the drive circuit drives the second digit line to the opposite level to the first digit line. Thus, true and complement logic states can be established in the first and second digit lines.

DESCRIPTION OF THE PRIOR ART

Figure 1:
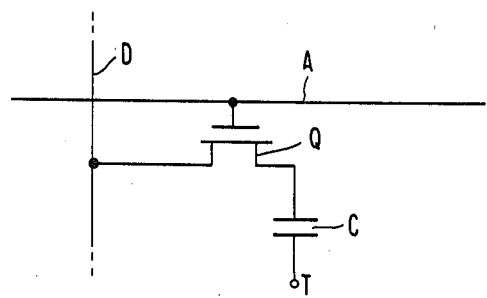
FIG. 1 is a circuit diagram showing a single transistor type memory cell.

FIG. 1 shows a circuit diagram of a known single transistor type memory cell. In this Figure, there are included a digit line D for transmitting information between a sense amplifier (not shown) and a memory cell; a capacitor C for holding the information as electric charges to which one terminal T biased at a preset constant potential is connected, a switching transistor Q and an address line A (usually called a word line) for controlling the switching transistor Q.

Figure 2:
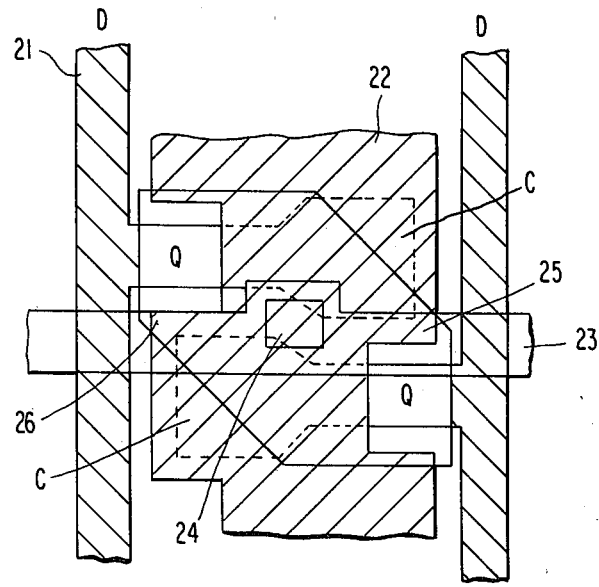
FIG. 2 is a top plan view showing the single transistor type memory cell on a semiconductor chip.

With reference to FIG. 2, one example of a known structure of the memory cell will be briefly explained. In this example, two bits of the memory cells are shown, in which the digit line is made of a diffusion layer whereas the address line is made of a metal wiring layer. Here, a diffusion layer 21 forms the digit line, and the polycrystalline silicon layer 22 of a first layer forms one electrode of the capacitor. A metal wiring layer 23 forms the address line. A contact 24 forms an electrical connection between the metal wiring layer 23 and a polycrystalline silicon 26 of a second layer. A silicon dioxide layer 25 functions as the dielectric layer of the capacitors. The polycrystalline silicon 26 of a second layer forms the gate of the switching transistor.

Figure 3:
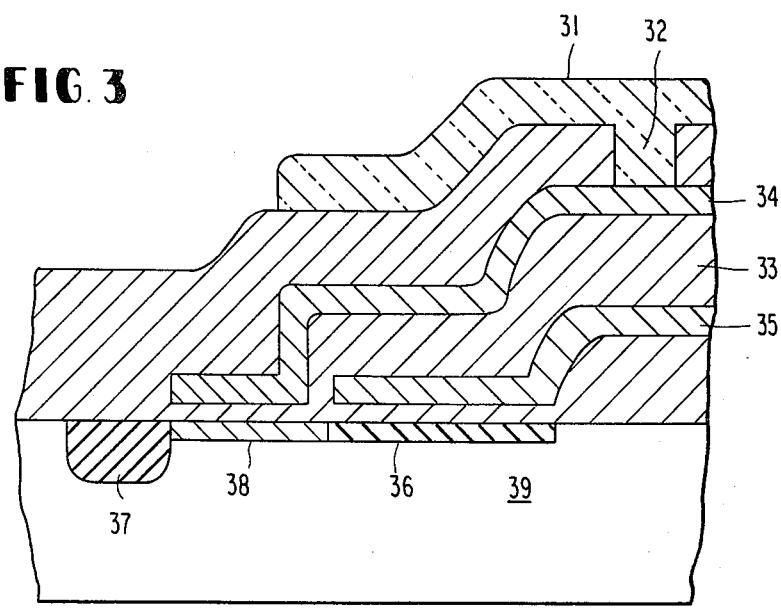
FIG. 3 is a sectional view showing the single transistor type memory cell.

A sectional structure of the memory cell is shown in FIG. 3.

In this Figure, there are included a metal wiring layer 31, a contact portion 32, a silicon dioxide film 33, a polycrystalline silicon layer 34 of a second layer, a polycrystalline silicon layer 35 of a first layer, an inversion or diffusion layer 36 as the other electrode of the capacitor, a diffusion layer 37 which is a portion of the digit line while making the drain of the switching transistor, a channel portion 38 of the switching transistor, and a silicon substrate 39.

Figure 4:
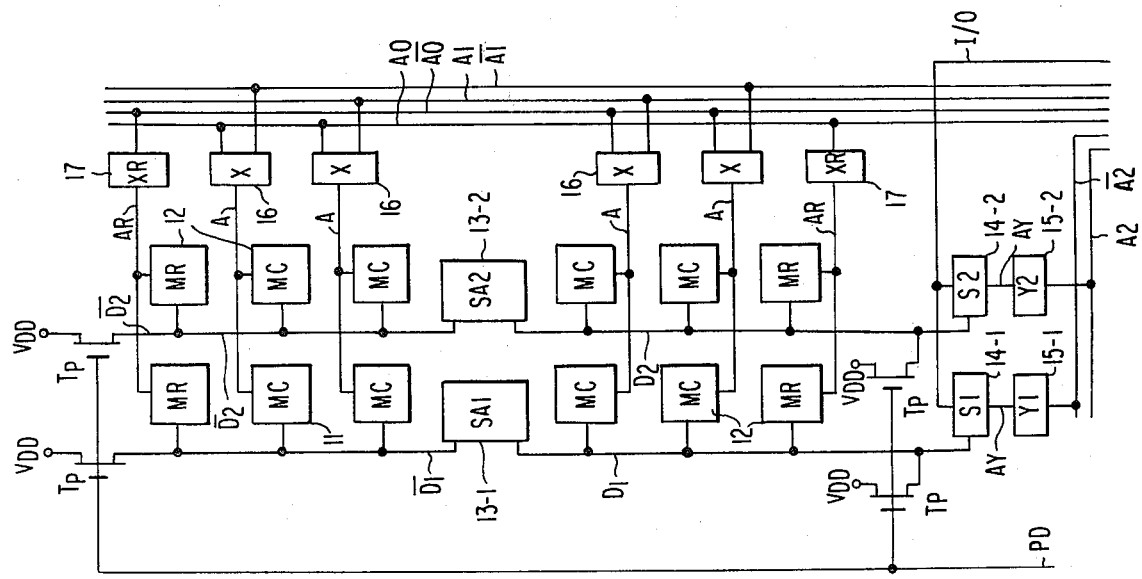
FIG. 4 is a block diagram showing major parts of the prior art memory device.

With reference to FIG. 4, one prior art example of a circuit diagram showing the memory array portion and its surroundings will be shown. The following description will be made in the case of eight bits by way of example. All the following description will be made in the case where N channel insulated gate field-effect transistors (IGFET) are employed. Similar description can be applied for P channel IGFETs.

Address true and complement signal lines A0, $\overline{A0}$, A1, $\overline{A1}$, A2 and $\overline{A2}$ which are derived from address inverters and buffers (not shown here), are selectively fed to a plurality of row decoders (X) 16, reference row decoders (XR) 17 and column decoders (Y) 15. From row decoders (X) 16 address lines A are derived to which memory cells (MC) 11 are coupled, with reference cells (MR) 12 coupled to reference address lines AR derived from the respective reference decoders (XR) 17. True and complement digit lines $D_1$ and $\overline{D_1}$ are coupled to a pair of differential inputs of a sense amplifier (SA 1) 13-1. Similarly, true and complement digit lines $D_2$ and $\overline{D_2}$ are coupled to a pair of differential inputs of a sense amplifier (SA 2) 13-2. The reference cell MR is operative to impart a reference potential to its relevant digit line. The reference address line AR controls the operations of the reference cell MR. The reference decoder (XR) 17 is operative to select the reference address line AR of the reference cell MR belonging to the digit line on the opposite side of the same sense amplifier as the memory cell selected by the row decoder (X) 16 in accordance with the address signal lines (i.e., only A0 and $\overline{A0}$ in this example). The letters SA indicate the sense amplifiers (SA-1, 2) 13-1 and 13-2 which amplify the minute potential difference between the true and complement digit lines which are derived from the reference cell MR and the memory cell MC, and are usual differential amplifiers. The column decoders (Y1 and Y2) 15-1 and 15-2 are coupled to column selection gates (S1 and S2) 14-1 and 14-2 through their output lines AY thereby to selectively couple the digit line $D_1$ and $D_2$ to an input/output (I/O) bus, respectively. A digit precharge pulse line PD operatively charges the respective digit line to a preset potential by transistor Tp before the reading or writing operation.

Figure 5:
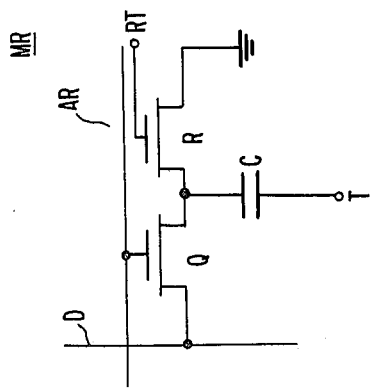
FIG. 5 is a circuit diagram showing a reference cell.

FIG. 5 shows a general structure of the reference cell MR. Here, the elements Q, C, T and D are made similar to those of the memory cell shown in FIG. 1, but the capacity of the capacitor C is reduced to $\frac{1}{2}$ to $\frac{1}{3}$ of that of the memory. A reset pulse line RT operatively drives a reset transistor R before the reading or writing operations thereby to discharge the capacitor C to a preset potential (i.e., ground potential in this example).

Figure 6:
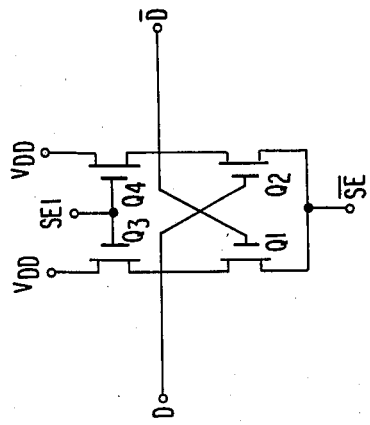
FIG. 6 is a circuit diagram showing one example of a static type sense amplifier.
Figure 7:
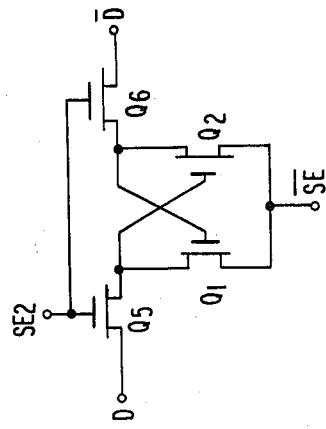
FIG. 7 is a circuit diagram showing one example of a dynamic type sense amplifier.

FIGS. 6 and 7 show, by way of example, two kinds (i.e., static and dynamic types) of the sense amplifiers, respectively.

In the digit sense amplifier shown in FIG. 6, a terminal SE is charged to a high potential before the amplification and discharged to ground potential upon initiation of the amplification. This sense amplifier is of the known flip-flop type and amplifies the minute potential difference of the two inputs (i.e., the drains of Q1 and Q2) D and $\overline{D}$. The terminal of D or $\overline{D}$, which has been at a low potential near the initiation of the amplification, is finally discharged to about ground potential, while the terminal D or $\overline{D}$ at the higher potential also has its potential reduced to some extent so that a terminal SE1 has to be at a high potential after initiation of the amplification so as to compensate that potential drop. As a result, when the potential of SE1 becomes high, one of transistors Q3 and Q4 has its source potential (D or $\overline{D}$) reduced to a low level so that a DC current is generated therethrough. This digit sense amplifier is called the static type sense amplifier.

The digit sense amplifier of FIG. 7 is not equipped with the load transistors such as the transistors Q3 and Q4 of the static type sense amplifier. Before initiation of the amplification, the terminal SE is charged to a high potential, and if the precharge potential of D and $\overline{D}$ is $V_D$, which is the potential of the power source, and if the threshold voltage of the transistors is $V_T$, the terminal SE2 is preset at a potential higher than $(V_D+V_T)$. Upon initiation of the amplification, the terminal SE is discharged to ground potential, and then the terminal SE2 has its potential reduced to about $V_D-V_T$. Since the transistors Q5 and Q6 remain nonconductive until the potential difference between the terminal SE2 and drain voltage of the transistors Q1 and Q2 becomes higher than $V_T$, the amplification by the transistors Q1 and Q2 is effected only by the node capacity of the drains of the transistors Q1 and Q2 so that any capacitances of the digit lines D and $\overline{D}$ are not exerted to reduce the potential drop at the higher potential side. Moreover, at the time when one the transistors Q5 and Q6 becomes conductive, a large difference is established between the node potentials of the drains of the transistors Q1 and Q2 thereby to reduce the potential drop at the higher potential side of D and $\overline{D}$ after that.

Thus, the digit sense amplifier consuming no DC current is called the dynamic type sense amplifier. This dynamic digit sense amplifier cannot drive the digit lines at a high potential.

The details of the dynamic type sense amplifier are described in U.S. Pat. No. 4,061,954 issued to Proebsting et al.

Figure 8:
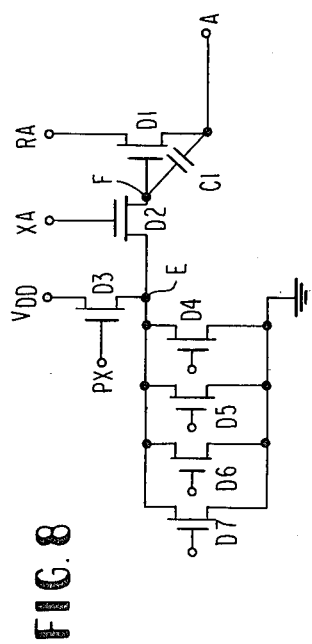
FIG. 8 is a circuit diagram showing one example of a row decoder.

FIG. 8 shows one example of the row decoder circuit X. This example corresponds to the case of the NOR type having four inputs. Transistors D4, D5, D6 and D7 are made receptive of one of the address signals of the address lines such as A0, $\overline{A0}$. All the inputs to this circuit are held at the ground potential until the operation is initiated. A terminal PX is charged in advance before initiation of the operation so that a potential up to $(V_{DD}-V_T)$ is established at nodes E and F by the transistor D3. At this instance, a terminal RA is held at ground potential. The terminal XA is usually supplied with potential in the vicinity of the power source $V_{DD}$. Immediately before initiation of the operations, the potential of the terminal PX is reduced to ground level thereby to render the transistor D3 nonconductive. If at least one of the transistors D4 to D7 is supplied with input at the high potential, the potential at the node F of the decoder is reduced to ground level. The row, where the node F is left at the high potential, is limited to that where the gates of the transistors D4 to D7 are all at the ground potential. Thus, one row can be selected. After that, when the potential of the pulse RA is raised from the ground level to the high level, the output A of the decoder selected, i.e., the potential of the address line, is accordingly raised. Incidentally, bootstrap capacitor C1 raises the potential at the node F over the $V_{DD}$ level.

Figure 9:
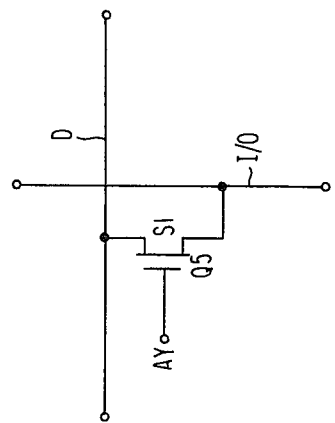
FIG. 9 is a circuit diagram showing one example of a column selection circuit.

FIG. 9 shows one example of the column selection gate S. This example is the simplest one and is constructed of one transistor Qs.

In the case of the memory structure of FIG. 4, the read from or the write into the memory cell is effected in following the manners. First, before the reading or writing operation, the digit lines are charged up to a preset potential (which is usually the potential of the power source $V_{DD}$), and the reference cell MR is reset. Before the address lines and the reference address lines are driven, the precharge pulse PD and the reset pulse RT are returned to the ground condition. When the address lines and the reference address lines are driven, the respective potentials at the digit lines D and $\overline{D}$ are varied in accordance with the reference cell MR and the state of the memory cell MC. The input signal level to be received by the sense amplifier SA is the potential difference between the true and complement digit lines D and $\overline{D}$. After that, if the sense amplifier SA is operated, the difference between D and $\overline{D}$ is extended to effect the amplification. The information of the memory cell MC is broken, before the sense amplifier SA is operated, whereupon it is rewritten.

The operations thus far described are simultaneously accomplished in the memory cells which are connected with the same address line. Moreover, it is assumed that the capacitor of the memory cell MC is written with a high potential. The charges are lost as leakage current to the substrate so that the potential is gradually reduced. Consequently, it is necessary for the dynamic memory to read all the memory cells at a preset time interval so that the rewrite may be accomplished by the sense amplifier SA. These operations are called "refresh". Those to be refreshed once are the memory cell connected with the same address line, and the reading times required for refreshing all the memory cells are referred to as a "refresh cycle", which is the number of the groups of the address lines which are not driven together. The refresh cycle in FIG. 4 is four cycle.

Upon completion of the refreshing operation, one column, i.e. one digit line, is selected by the column decoder Y and the column selection gate S, and thus the I/O bus and the digit line of its column are electrically connected. If it is intended to accomplish the reading operation at this time, the I/O bus is connected with the output circuit. The I/O bus is charged with a preset potential, usually with a high potential. If it is intended to accomplish the writing operation at that time or thereafter, the I/O bus is connected with the output of a writing amplifying circuit and is driven with a high or low potential in accordance with a write data. Incidentally, the operation of effecting the writing operation at the same address within the same cycle once the reading operation is accomplished is referred to as a "read-modify-write".

As in the above, even in the writing cycle or the read-modify-write, after the sense amplifier has completed its amplification in response to the information of the memory cell, the writing operation into the digit line is accomplished. Consequently, in case the digit lines which are not connected to the I/O bus are at a low potential, it is difficult for the dynamic type sense amplifier to write the high potential. If the number of the sense amplifiers is increased with increasing capacity, the static digit sense amplifier has its power consumption increased so that it has to be replaced by the dynamic type sense amplifier.

In the case of the dynamic type sense amplifier, two I/O buses are used and connected with the two digit lines D and $\overline{D}$ according to the prior art.

These two I/O buses are charged with a preset potential, before the sense amplifier is operated, and have mutually complementary phases in accordance with the memory cell information or the write information upon the reading or writing operations.

Figure 11:
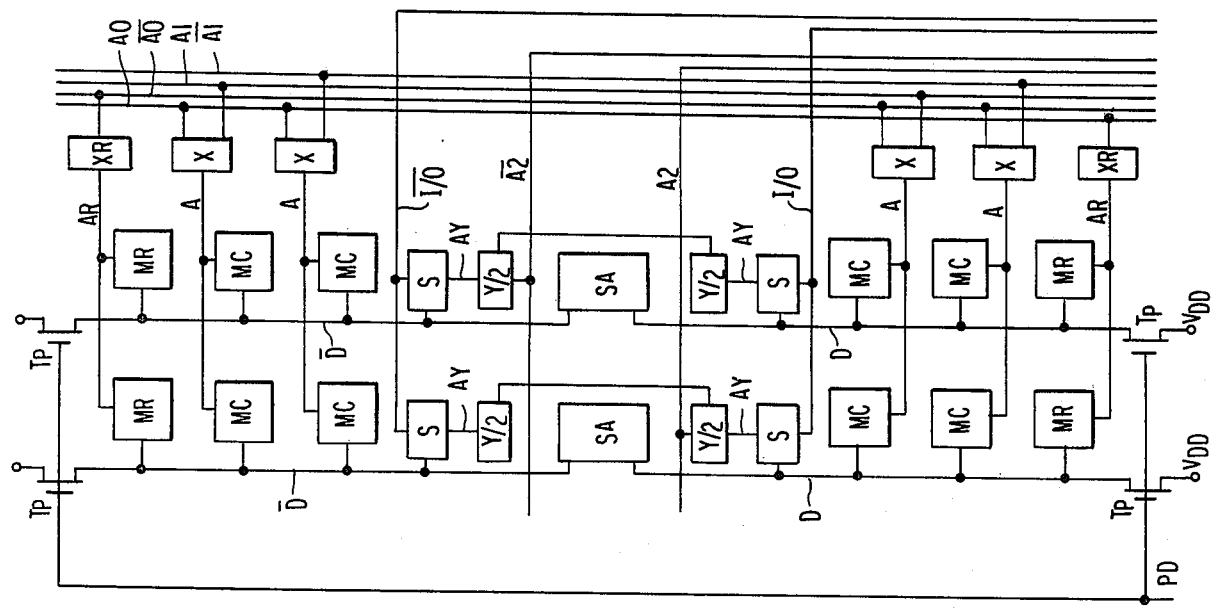
FIG. 11 is a block diagram showing an example of the prior art memory device.
Figure 13:
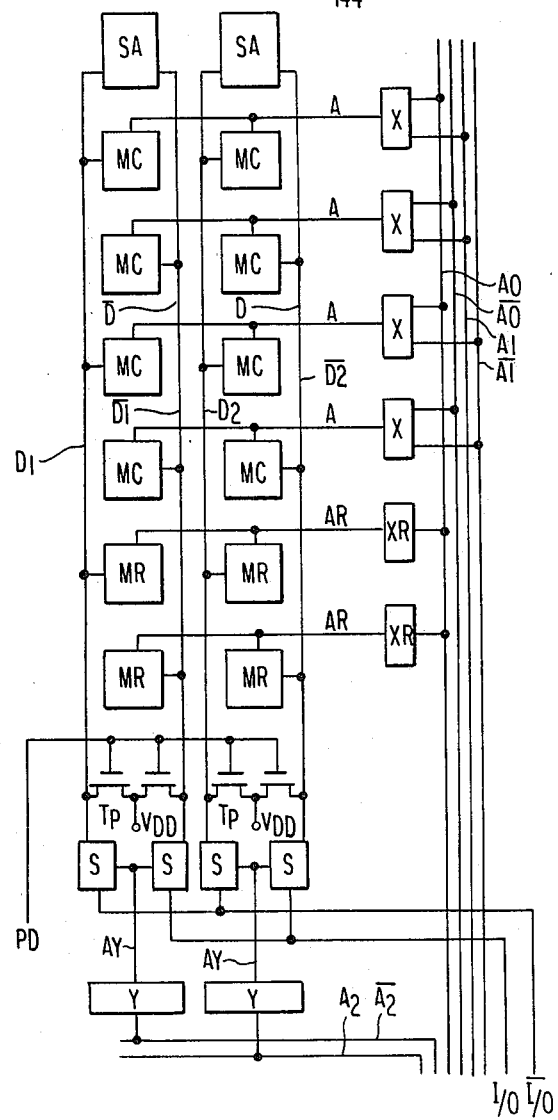
FIG. 13 is a block diagram showing an arrangement example of the memory device.
Figure 15:
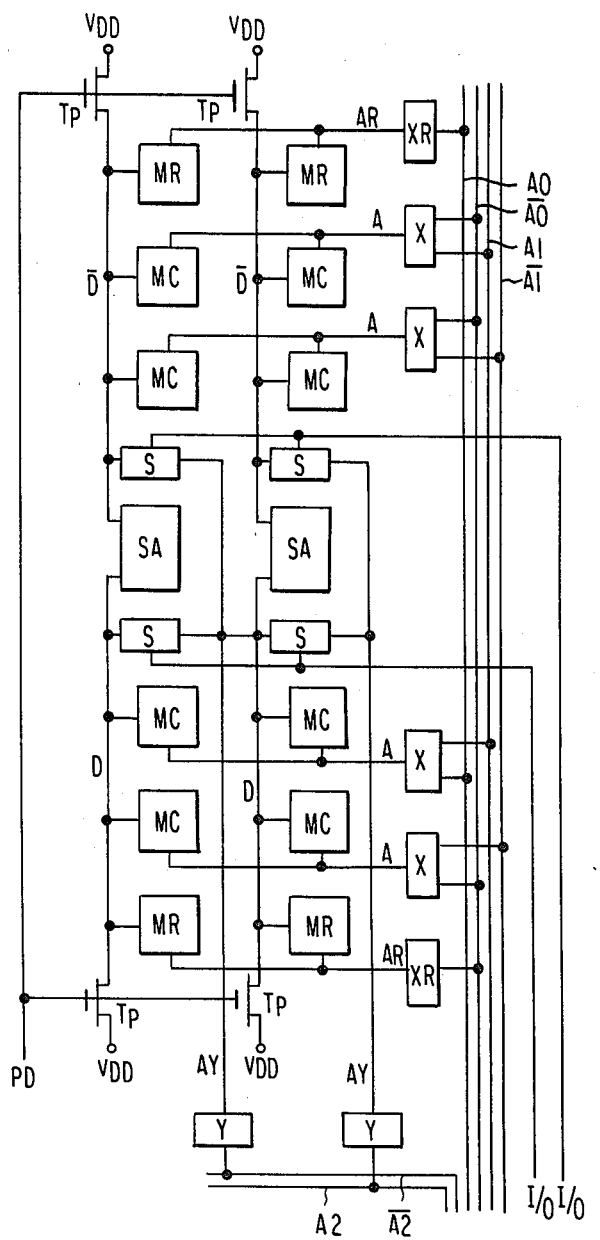
FIG. 15 is a block diagram showing an arrangement example of the memory device.

FIGS. 11, 13 and 15 shows the conventional circuit diagrams using two I/O buses.

Figure 10:
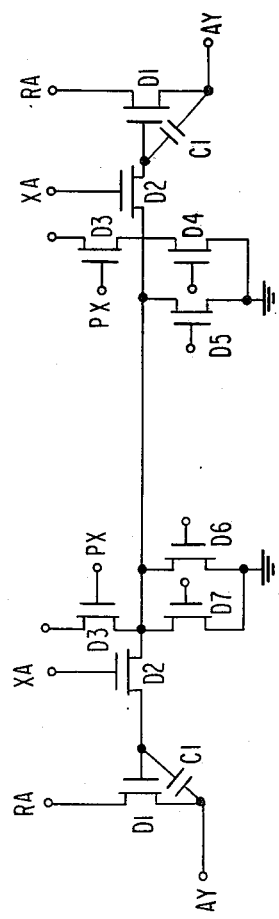
FIG. 10 is a circuit diagram of a column decoder.

FIG. 11 shows a memory circuit, in which the column decoder Y/2 and the column selection gate S are arranged at both sides of the digit sense amplifier SA. Here, the column decoder Y/2 is the type in which the row decoder of FIG. 8 is divided, as shown in FIG. 10. In other words, the sense amplifier SA is arranged between the transistors D5 and D6. Here, reference letters I/O and $\overline{I/O}$ indicate the two I/O buses, and the other reference letters are similar to those of FIG. 4.

In this circuit, as shown in FIG. 10, two driver portion (i.e., the portion other than the transistors D4 to D7 of FIG. 10) of the decoder are required. Since, moreover, the decoder portion is next to the digit lines (mainly made of diffusion layer), the capacity Cd of the digit lines is increased so that the input signals to the sense amplifier SA are made low.

Figure 12:
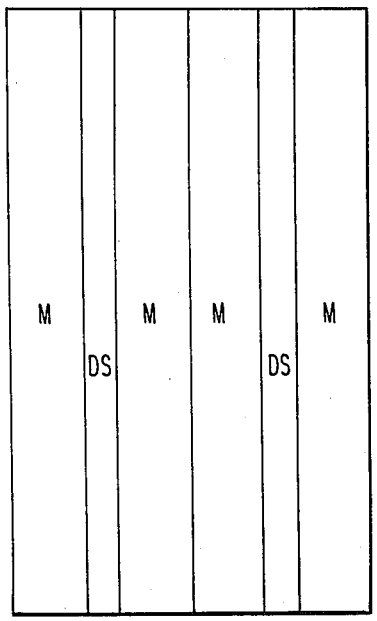
FIG. 12 is a block diagram showing arrangement of the sense amplifiers and the memory cells.

If, moreover, the number of the address lines is decreased with a view to reduce the capacitance Cd and the refresh cycles, the address lines become longer (in the case of 65K memory and 128 refresh cycles, for example). In this particular case, as shown in FIG. 12, such a layout is accomplished with two columns of the digit sense amplifiers DS. In FIG. 12, reference letter M indicates a memory cell array, and reference letters DS indicate the column of the sense amplifier.

Thus, if the digit sense amplifiers are arrayed in two columns, the column decoders have two columns in accordance with the construction of FIG. 11 and become larger than that of FIG. 4.

FIG. 13 shows other memory structure in which the respective pairs of digit lines ($D_1$ and $\overline{D_1}$) and ($D_2$ and $\overline{D_2}$) located at both sides of the sense amplifier SA are arranged such that they are bent to one of the sense amplifiers SA. This layout of the digit lines is called "folded bit line. In this type, the memory cells MC can hardly use the diffusion layer 37 of FIG. 2 as the digit lines and is prepared such that the digit lines are made of the metal wiring layer and that the address lines are made of the polycrystalline silicon of the second layer.

Figure 14:
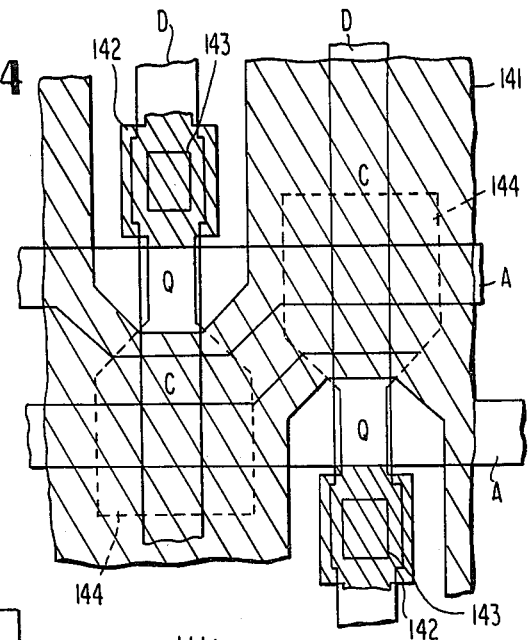
FIG. 14 is a top plan view showing another example of the memory cell.

FIG. 14 is a top plan view showing the two bits of the memory cells thus prepared.

Here, there are included the polycrystalline silicon 141 of a first layer making one electrode of the capacitor C, the diffusion layer 142 which is a portion of the digit lines while making the drain of the switching transistor, a contact 143 between the metal wiring layer (D) making the digit line and the diffusion layer 142 and an inversion or diffusion layer 144 which is the capacitor portion.

In the memory cell of the type thus described, a memory cell capacitance Cs of the capacitor C is larger than that of the memory cell in which a digit line is made of the diffusion layer; and the capacitance of the digit lines is also substantially the same. Since, however, the address lines are made of the polycrystalline silicon, their wiring resistance is increased (to a level as high as about 1000 times that of the metal wiring layer). Then, the read from the memory cell, which is located at a remote position with respect to the row decoder, is retarded. Moreover, the digit line capacitance Cd is made larger than the case where no bending is performed while using the metal wiring layer.

FIG. 15 shows still other memory structure according to the prior art, in which the row decoder Y is arranged at one side, in which the column selection gates S are arranged at both sides of the sense amplifier SA and in which the output line AY of the column decoder Y, i.e., the column address line, is arrayed above the memory cell array to the column selection gate S. In this structure, as shown in FIG. 14, through the memory cell MC can be constructed such that the digit lines and the column address line AY are made of the metal wiring layer and so that the address line is made of the polycrystalline silicon, it is not possible to avoid the retarding of the reading and writing operations.

Figure 16:
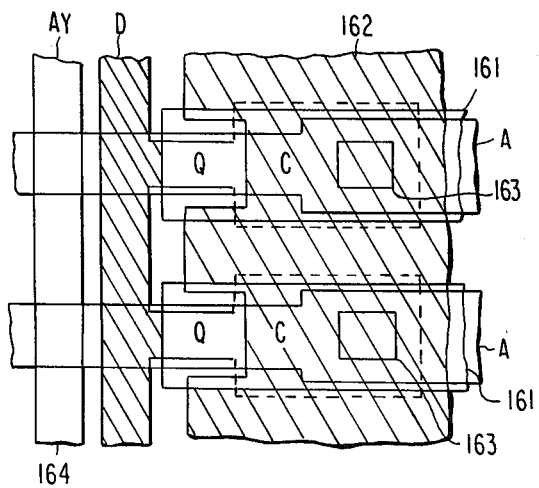
FIG. 16 is a top plan view showing an example of the memory cell used in FIG. 15.

On the other hand, there has also been developed a memory cell, in which the digit line is made of the diffusion layer and the address line is made of the metal wiring layer; while the row address line is made of the polycrystalline silicon. Two bits of such memory cells are shown in FIG. 16. As shown in this Figure, the memory cells are fabricated with the polycrystalline silicon 161 of a second layer making the gate of the switching transistor, the polycrystalline silicon 162 of a first layer making one electrode of the capacitor, a contact 163 between the metal wiring layer (A) making the address line and the polycrystalline silicon of a second layer making the gate of the switching transistor, and the polycrystalline silicon 164 of a second layer making the row address line. Since the line AY and the line D can be arranged close to each other but cannot be overlaid because they are of different layers, the capacitance Cs of the capacitor is made smaller than that of the memory cell of FIG. 2. That is to say, the input signal level Cs/Cd of the sense amplifier is small.

As described above, in the prior art memory structures, it has been difficult to make compatible the concept of increasing the ratio of Cs/Cd to stabilize the circuit, the concept of reducing the resistance of the address line to ensure the high speed operation of the circuit, the concept of adopting the dynamic digit sense amplifier to reduce the power consumption, and the concept of reducing the size of the chip to increase the memory capacity and to reduce the cost.

DETAILED DESCRIPTION OF THE INVENTION

The present invention will be described in connection with the embodiment thereof in the following.

Figure 17:
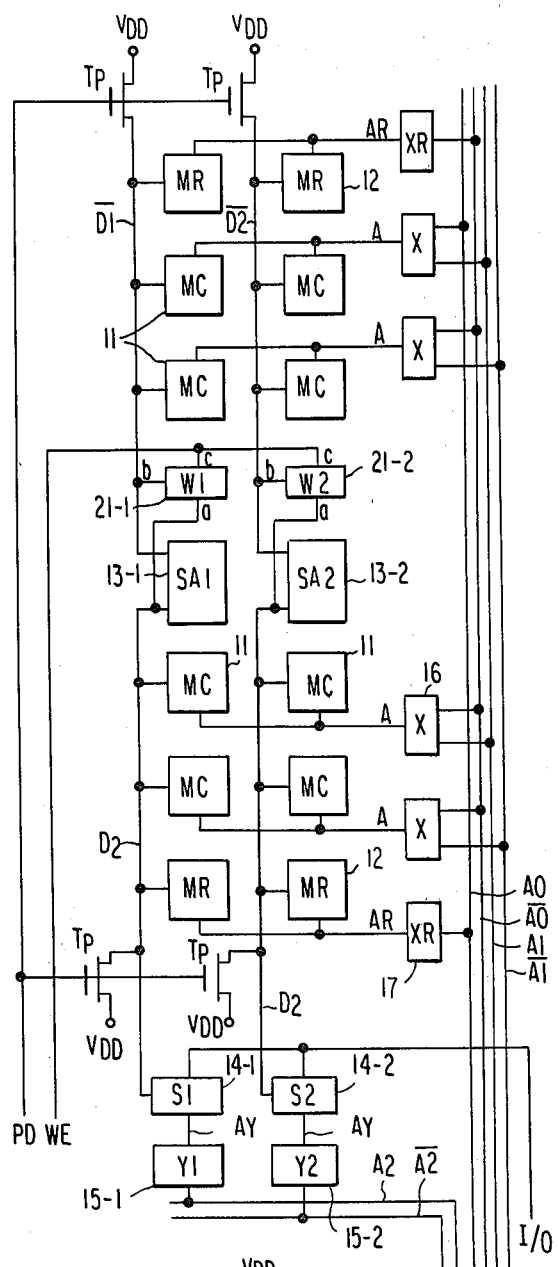
FIG. 17 is a block diagram showing the memory device according to one embodiment of the present invention.

With reference to FIG. 17, a first embodiment of the present invention will be described.

In this memory device, the basic layout is substantially similar to that of FIG. 4. In the column direction, pairs of digit lines ($D_1$, $\overline{D_1}$) and ($D_2$ and $\overline{D_2}$) are arrayed. The digit lines $D_1$ and $D_1$ are coupled to a pair of differential inputs of the dynamic type sense amplifier (SA1) 13-1 while the digit lines $D_2$ and $D_2$ are coupled to a pair of differential inputs of the dynamic type sense amplifier (SA2) 13-2. The sense amplifiers (SA1, SA2) may be structured as shown in FIG. 7. A plurality of address lines A derived from a plurality of row decoders (X) 16 and a plurality of reference address lines AR derived from reference row decoders (XR) 17 are arranged in the row direction.

The digit line $D_1$ is adapted to be electrically connectable to a single input/output (I/O) bus through a column selection gate (S1) 14-1 which is controlled by an output AY of a column decoder (Y1) 15-1. Similarly, the digit line $D_2$ is adapted to be electrically connectable to the single input/output (I/O) bus through a column selection gate (S2) 14-2 controlled by a column decoder (Y2) 15-2. Memory cells MC of the single transistor type are disposed at the respective intersections of the digit lines and the address lines A. The digit lines $\overline{D_1}$ and $\overline{D_2}$ are left without coupling to any input/output bus. Here, according to the present invention, there are provided digit drive circuits ($W_1$ and $W_2$) 21-1 and 21-2 near the sense amplifiers (SA1 and SA2) 13-1 and 13-2, respectively. The digit drive circuit ($W_1$) 21-1 has an input terminal 'a' connected to the digit line connectable to the single I/O bus, an output terminal 'b' connected to the digit line $\overline{D_1}$ left alone and a control terminal 'C' supplied with a write signal WE. Similarly, the digit drive circuit (W2) 21-2 has an input terminal a connected to the digit line $D_2$, an output terminal 'b' connected to the digit line $\overline{D_2}$ and a control terminal 'C' supplied with the write signal WE.

The digit drive circuits ($W_1$, $W_2$) 21-1 or 21-2 detect the level at the digit lines $D_1$ or $D_2$ and drive the digit lines $D_1$ or $D_2$ to a complementary level to that of the digit line $D_1$ or $D_2$ when the write signal WE is brought to its active level on a write operation.

By the digit drive circuits 21-1 or 21-2, the levels at the digit line $\overline{D_1}$ or $\overline{D_2}$ are established and held in a stable manner, especially on the write operation. Here, though the write signal WE is indicated as a single signal by way of example, it may be a multi-phase signals in a practical case.

Figure 18:
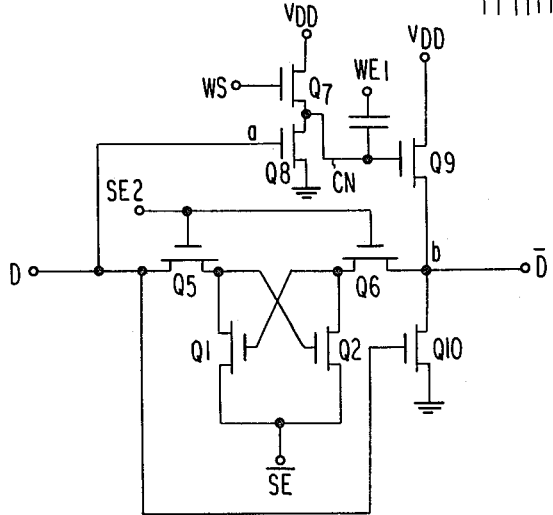
FIG. 18 is a circuit diagram showing the drive circuit shown in FIG. 17.
Figure 19:
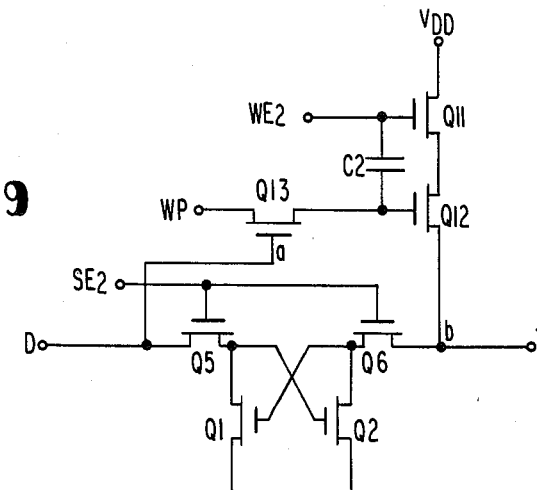
FIG. 19 is a circuit diagram showing another example of the drive circuit shown in FIG. 17.

FIGS. 18 and 19 show examples of the digit drive circuit together with the sense amplifier.

In both FIGS. 18 and 19, the transistors Q1, Q2, Q5 and Q6 form the dynamic type sense amplifiers as shown in FIG. 7, in which the reference letters D and $\overline{D}$ indicate the digit lines, the former D being connected with the single I/O bus. The signals SE2 and $\overline{SE}$ are the pulses for operating the sense amplifiers similarly to those of FIG. 7.

FIG. 18 corresponds to the example of the write drive circuit for generating a low potential at the output terminal D in response to an input a at a high potential. The digit drive circuit is composed of transistors Q7, Q8, Q9 and Q10, in which the transistors Q7 and Q8 form an inverter circuit and the transistors Q9 and Q10 form a push-pull circuit. The transistors Q7 and Q8 are preset such that the transistor Q8 has a lower conductive resistance than the transistor Q7 and their common junction point CN connected to a gate of the transistor Q9 is set below a threshold voltage of the transistor Q9 even if both a signal WS and a level at D are at high potentials. A pulse WS is made a high level and a pulse WE1 is made a high level slightly after the pulse WS when the write operation is intended. Prior to the writing operation, the pulses WS and WE1 are preset at the ground potential. When the writing operation is initiated so that the digit line D begins to be driven towards a low level by the I/O bus, the pulse WS takes the high potential so that the common junction point CN has the opposite potential, i.e. a high level, to that of the digit line D. If the potential of the pulse WE1 is made high after the level of the digit line D is completely determined and the transistor Q8 is held under its nonconductive conditions the level of the gate of the transistor Q9 is further raised to reduce the ON resistance of the transistor Q9 by the known bootstrap effect by a capacitor C2 and the pulse WE1. While, in case of the high potential at the digit line D, the transistor Q7 generates a DC current with the transistor Q8, but the load capacity of the transistor Q7 is low and the sum of the gate capacity of the transistor Q9 and the capacity of C2 while the ON resistance of the transistor Q7 is small and hence the power consumption is small. In these ways, when the level of the digit line D is low, the level of the digital line $\overline{D}$ can be held at a high level through sufficiently conducting transistor Q9.

On the other hand, when the level of the digit line D is high, the level of the digit line $\overline{D}$ can be held at a low level by conducting transistor Q10. Thus, the digit line $\overline{D}$ can be driven in a complementary manner with respect to the digit line D.

FIG. 19 shows another embodiment of the digit drive circuit together with the sense amplifier. In this embodiment, the digit drive circuit has its output resistance increased to a remarkably high level when the digit line D is at a high potential.

Here, the signals WP and WE2 are made an active level during the write operation. In this embodiment, the write signal WP is held at a high potential whereas the write signal WE2 is held at a low potential before the writing operation. Since the digit lines are precharged with a high potential prior to the operation of the sense amplifier, the potential at the gate of a transistor Q12 becomes high. When the writing operation is initiated so that the digit line D is driven through the I/O bus to a low level thereby to have its potential determined, the signal WP is discharged to the ground potential. Then, the gate of the transistor Q12 has its potential (high level) opposite to that of the digit lines D. Then if the potential of the signal WE2 is raised to a high level, the gate of the transistor Q12 is further raised by the bootstrap effect due to capacitor C2 so that the level at the digit line $\overline{D}$ can be held high through the transistors Q11 and Q12.

Thus, the drive of the digit line $\overline{D}$ to the high potential is effected by the transistors Q11 and Q12, whereas the drive of the same to the low potential is effected by the transistors Q6 and Q2 in the sense amplifier. For the high potential of the input, i.e., at the digit line D, the output resistances of Q11 and Q12 take remarkably high values.

Figure 20:
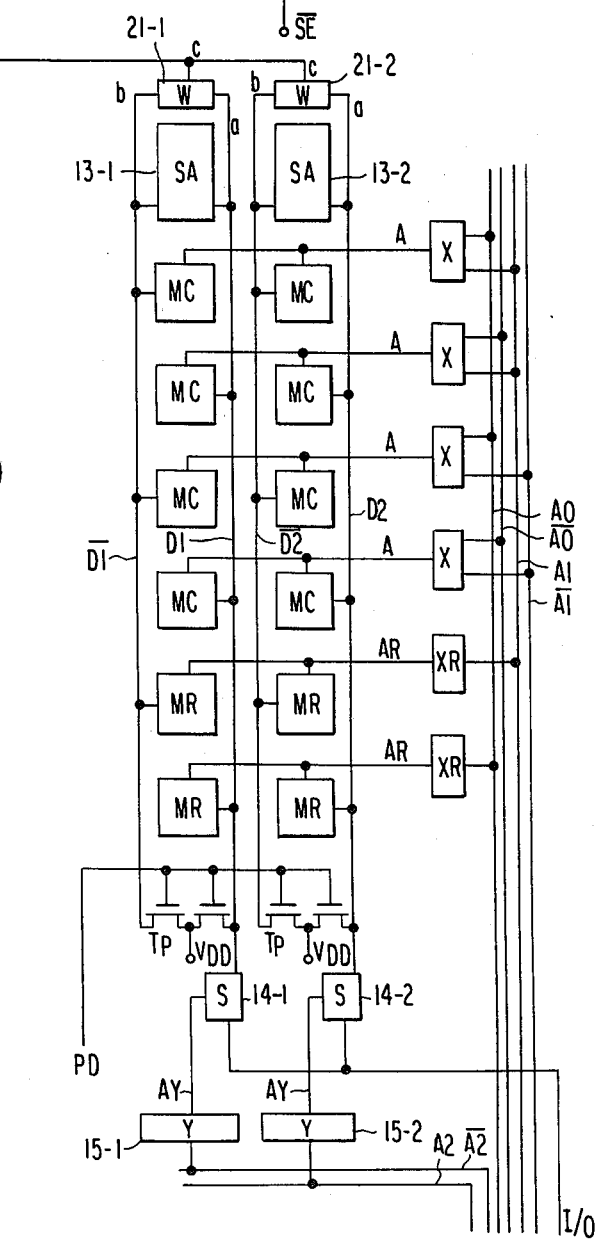
FIG. 20 is a block diagram showing another embodiment of the present invention.

With reference to FIG. 20, a memory device according to another embodiment of the present invention will be described.

In this embodiment, the present invention is applied to the folded-bit (digit) line type memory cell array where a pair of digit lines $D_1$ and $\overline{D_1}$ are arranged in parallel. Dynamic type sense amplifiers (SA) 13-1 and 13-2 are disposed at the same ends of the digit lines ($D_1$, $\overline{D_1}$) and ($D_2$, $\overline{D_2}$), respectively. In this case, a single input/output (I/O) bus line is employed and the digit lines $D_1$ and $D_2$ are adapted to be connectable to the single I/O bus line through the column selection gates 14-1 and 14-2 under control of the column decoders 15-1 and 15-2, respectively. The digit lines $\overline{D_1}$ and $\overline{D_2}$ have no interface with any I/O bus lines and are left as they are. Here, according to the present invention the digit drive circuits (W) 21-1 and 21-2 are added for driving the digit lines $\overline{D_1}$ and $\overline{D_2}$, respectively. The write drive circuits may be structured as shown in FIG. 18 and 19.

In the above descriptions, though the digit drive circuit is made active when the write operation is performed, it is not restricted to this case. For example, it is useful to enable the write drive circuit after the read operation is achieved, where regenerated level at the digit line can be effectively provided.

As has been described hereinbefore, according to the present invention, it is unnecessary to provide two sets of I/O buses column decoders and column selection gates, and the dynamic digit sense amplifier can be used (although the static digit sense amplifier can naturally be used in place of the former). Also, the address lines can use the metal wiring layer. Reduced capacitance of the digit lines and the reduced resistance of the address lines can be realized. Moreover, since it is unnecessary to arrange the column address lines on the memory cell array, the capacitor of the memory cell can be enlarged to increase the ratio of Cs/Cd.

Therefore, it is possible to realize a semiconductor memory device which is stable in its operation and which can be operable at a high speed, with low power consumption, high capacity and low cost.

I claim:

1. A semiconductor memory device comprising a plurality of digit line pairs, each of said digit line pairs including a first digit line and a second digit line, a plurality of memory cells, a plurality of sense amplifiers respectively provided for said digit line pairs and adapted to operatively amplify a potential difference between the first digit line and the second digit line of the associated digit line pair, a bus line, and means for selectively transferring a logic level of the first digit line of one of said digit line pairs to said bus line, and a plurality of drive circuits, each said drive circuit being responsive to a first level of the first digit line of the associated digit line pair for operatively making a potential of the second digit line of said associated digit line pair to a second level, each of said drive circuits including an inverter circuit receiving a signal from the first digit line and switching means responsive to an output of said inverter circuit for operatively feeding a power supply voltage to the second digit line.

2. The device according to claim 1, further comprising means responsive to the second level of the first digit line for making the level of second digit line to the ground potential.

3. A semiconductor memory device comprising a plurality of digit line pairs, each of said digit line pairs including a first digit line and a second digit line, a plurality of memory cells, a plurality of sense amplifiers respectively provided for said digit line pairs and adapted to operatively amplify a potential difference between the first digit line and the second digit line of the associated digit line pair, a bus line, and means for selectively transferring a logic level of the first digit line of one of said digit line pairs to said bus line, and a plurality of drive circuits, each said drive circuit being responsive to a first level of the first digit line of the associated digit line pair for operatively making a potential of the second digit line of said associated digit line pair to a second level, each of said drive circuits including a series circuit of first and second transistors, said series circuit having one terminal receiving a power supply voltage and the other terminal coupled to the second digit line, means for supplying a gate of said first transistor with a first control signal, a third transistor having a gate coupled to the first digit line and one of a source and a drain coupled to a gate of said second transistor, and means for supplying the other of said source and drain of said third transistor with a second control signal.

4. The device according to claim 3, in which said first control signal takes the second level and said second control signal takes the first level during a write operation.

5. The memory device according to claim 1, in which each of said sense amplifiers includes first to third circuit nodes, a first field effect transistor coupled between said first and third circuit nodes and having a gate coupled to said second circuit node, a second field effect transistor coupled between said second and third nodes and having a gate coupled to said first node, a third field effect transistor coupled between the associated first digit line and said first circuit node, and a fourth field effect transistor coupled between the associated second digit line and said second circuit node.

6. A memory device comprising a plurality of digit line pairs, each of said digit line pairs including first and second digit lines, a plurality of address lines, a plurality of memory cells disposed at intersections of said address lines and digit lines, a plurality of sense amplifiers having first and second input terminals, a plurality of first connection means each for connecting the first digit line of one of said digit line pairs to the first input terminal of the associated sense amplifier, a plurality of second connection means each for connecting the first digit line of one of said digit line pairs to the second input terminal of the associated sense amplifier, a bus line, a plurality of column selection means each coupled between the first digit line of the associated digit line pair and said bus line, a plurality of digit drive circuits, each of said digit drive circuits including an input terminal, an output terminal and a control terminal and being responsive to a first logic level of the first digit line of the associated digit line pair for operatively supplying the second digit line of the same digit line pair with a potential of a second logic level, means for supplying the control terminals of said digit drive circuit with a control signal when a write operation is conducted, whereby the second logic level is forcibly established on the second digit line of the selected digit line pair as well as the first logic level being applied to the first digit line of said selected digit line pair through said bus line during the write operation.

7. The memory device according to claim 6, in which each of said sense amplifiers includes a common node, a first field effect transistor coupled between the first input terminal of the sense amplifier and the common node and having a gate coupled to the second input terminal of the same sense amplifier, and a second field effect transistor coupled between the second input terminal of the same sense amplifier and the common node and having a gate coupled to the first input terminal of the same sense amplifier.

8. The memory device according to claim 6, in which each of said digit drive circuits includes an inverter having an input terminal receiving the signal from the first digit line and enabled by the control signal, and switching means responsive to an output of said inverter for operatively feeding a predetermined potential to the second digit line.

9. The memory device according to claim 6, in which each of said digit drive circuits includes a potential terminal receiving a predetermined potential, a series circuit of first and second transistors coupled between said potential terminal and the second digit line of the associated digit line pair, means responsive to a potential at the first digit line for rendering said first transistor conductive and means responsive to said control signal for rendering said second transistor conductive.

10. The memory device according to claim 6, in which each of said digit drive circuits is located adjacent to the associated sense amplifier.

11. A memory device comprising a first digit line, a second digit line, a plurality of address lines, a plurality of memory cells, precharge means for operatively precharging said first and second digit lines to a precharge potential, a sense amplifier having first and second input nodes and a control node, means for connecting said first input node to said first digit line, means for connecting said second input node to said second digit line, means for operatively supplying said control node with a first control signal upon each of read and write operations thereby to discharge one of said first and second digit lines towards a reference potential by said sense amplifier without substantially discharging the other of said first and second digit lines, a bus line, means for operatively connecting said bus line to said first digit line, a digit drive circuit having an input node, an output node and a control node, means for connecting the input node of said digit drive circuit to said first digit line, and means for connecting the output node of said digit drive circuit to said second digit line, means for supplying the control node of said digit drive circuit with a second control signal when write operation is conducted, said digit drive circuit operatively charging said second digit line with a predetermined potential of a value not less than said precharge potential in response to said second control signal when a potential of said first digit line is near said reference potential.

12. The circuit according to claim 11, in which said digit drive circuit includes an inverter circuit receiving a signal from the first digit line and switching means responsive to an output of said inverter circuit for operatively feeding said predetermined potential to the second digit line.

13. The memory device according to claim 11, in which said digit drive circuit includes a series circuit of first and second transistors, means for supplying one end of said series circuit with said predetermined potential, means for coupling the other end of said series circuit to the second digit line, means for supplying a gate of said first transistor with said second control signal, and means for disabling said second transistor when the potential of said first digit line is near said precharge potential.

14. A memory device comprising a plurality of address lines, a plurality of first digit lines, a plurality of second digit lines, a plurality of memory cells disposed at intersections of said address lines and digit lines, a plurality of sense amplifiers each having a first input node adapted to be connected to the associated first digit line and a second input node adapted to be connected to the associated second digit line, a single bus line, a plurality of selection gates each coupled to the associated first digit line and said single bus line, the selected first digit line being connected to said single bus line via the associated selection gate while the second digit lines are left without coupling to any bus line, a first logic level on the first digit line being maintained by the associated sense amplifier while a second logic level on the second digit line is kept at a high-impedance state, a plurality of digit drive circuits, each of said digit drive circuits being responsive to the associated one of said first digit lines for forcibly maintaining the associated one of said second digit lines at the said second logic level.

15. The memory device according to claim 14, further comprising column selection means for selectively enabling one of said column selection gates and means for controlling said drive circuits.

16. The memory device according to claim 14, in which each of said sense amplifiers includes first and second circuit nodes, a pair of transistors having cross-coupled drains and gates at said first and second circuit nodes, first resistance means coupled between said first circuit node and said first input node and second resistance means coupled between said second circuit node and said second input node.

17. The device according to claim 14, in which said drive circuit includes an inverter circuit receiving a signal from the first digit line and switching means responsive to an output of said inverter circuit for operatively feeding a power supply voltage to the second digit line.

18. The device according to claim 14, further comprising means responsive to the second level of the first digit line for making the level of second digit line to the ground potential.

19. The device according to claim 14, in which said drive circuit includes a series circuit having a first and a second transistor having one terminal receiving a power supply voltage and the other terminal coupled to the second digit line, means for supplying a gate of said first transistor with a first control signal, a third transistor having a gate coupled to said first digit line and a source coupled to a gate of said second transistor, and means for supplying a drain of said third transistor with a second control signal.

20. A memory device comprising first and second digit lines, a plurality of address lines, a plurality of memory cells interposed at intersections of said address lines and digit lines, a sense amplifier having first and second input terminals, means for precharging said first and second digit lines at a predetermined potential prior to the operation of said sense amplifier, means for connecting said first digit line to said first input terminal, means for connecting said second digit line to said second input terminal, a bus line, gate means for operatively connecting said bus line to said first digit line, said second digit line being left without coupling to any bus line, a first logic level being applied to said first digit line through said bus line while a second logic level is generated on said second digit line by maintaining the precharged state of said second digit line under a high-impedance state when said bus line is in the first logic level during a write period, and a drive circuit responsive to the first logic level of said first digit line for establishing an electrical path to said second digit line from a potential source of a value not less than said predetermined potential.

* * * * *

UNITED STATES PATENT AND TRADEMARK OFFICE
CERTIFICATE OF CORRECTION

PATENT NO. : 4,389,714
DATED : June 21, 1983
INVENTOR(S) : Masumi Nakao

It is certified that error appears in the above-identified patent and that said Letters Patent is hereby corrected as shown below:

Column 1, line 8, "device" should be --devices--.
Column 1, line 16-17 "devided" should be --divided--.
Column 1, line 20, change "type system of" to --type of system--.
Column 4, line 49, "D" (second occurrence) should be --$\overline{D}$--.
Column 4, line 64 after "one" insert --of--.
Column 5, line 19, after "with" insert --a--.
Column 5, line 23, after "with" insert --an--.
Column 6, line 36, "D" (second occurrence) should be --$\overline{D}$--
Column 7, line 45, "through" should be --though--.
Column 8, line 23, "DI" (second occurrence) should be --$\overline{DI}$--
Column 8, line 25, "D2" (second occurrence) should be --$\overline{D2}$--
Column 8, line 52, "a" should be --'a'--.
Column 10, line 36, after "where" insert --the--.
Column 10, line 40, after "buses" insert --or--.

Signed and Sealed this

Twenty-seventh Day of March 1984

[SEAL]

Attest:

GERALD J. MOSSINGHOFF

Attesting Officer   Commissioner of Patents and Trademarks